United States Patent [19]

Gau et al.

[11] Patent Number: 4,478,654

[45] Date of Patent: Oct. 23, 1984

[54] AMORPHOUS SILICON CARBIDE METHOD

[75] Inventors: Shek-Chung Gau, Hamilton Township, Mercer County; Vikram L. Dalal, Lawrenceville, both of N.J.

[73] Assignee: Chronar Corporation, Princeton, N.J.

[21] Appl. No.: 337,628

[22] Filed: Jan. 7, 1982

[51] Int. Cl.³ .......................................... H01L 21/205
[52] U.S. Cl. .................................. 148/174; 136/258; 423/346; 427/74; 427/86; 427/95; 427/249; 357/2; 357/30; 357/17; 420/903
[58] Field of Search .................... 423/346; 427/74, 85, 427/86, 87, 95, 249; 148/174; 136/258 AM; 357/2, 17, 30; 75/134 S, 134 D, 135; 420/903

[56] References Cited

U.S. PATENT DOCUMENTS

| | | | |
|---|---|---|---|
| 3,520,740 | 7/1970 | Addamiano | 148/175 |
| 4,109,271 | 8/1978 | Pankove | 357/30 |
| 4,239,554 | 12/1980 | Yamazaki | 136/255 |
| 4,329,699 | 5/1982 | Ishihara et al. | 357/2 |
| 4,357,179 | 11/1982 | Adams et al. | 148/1.5 |
| 4,363,828 | 12/1982 | Brodsky et al. | 427/39 |

OTHER PUBLICATIONS

S. C. Gau et al., "Preparation of Amorphous Silicon Films by Chemical Vapor Deposition from Higher Silanes $Si_nH_{2n+2}(n>1)$", *Appl. Phys. Lett.*, vol. 39, pp. 436–438 (1981).

R. M. Plecenik et al., "Preparation of Amorphous Silicon by Chemical Vapor Deposition," *IBM Tech. Disc. Bull.*, vol. 24, pp. 1523–1524, (Aug. 1981).

*Primary Examiner*—Aaron Weisstuch
*Attorney, Agent, or Firm*—George E. Kersey

[57] ABSTRACT

Preparation of amorphous semiconductor carbides that are suitable for use in a wide variety of devices by the pyrolytic decomposition of a mixture of one or more semiconductanes and one or more carbanes.

13 Claims, 6 Drawing Figures

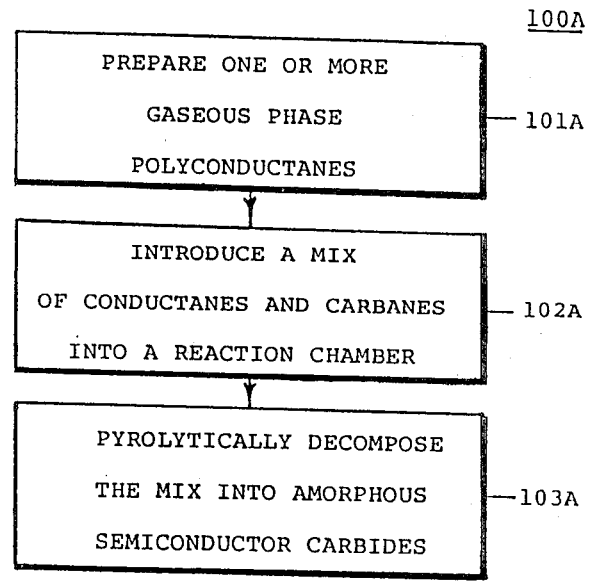
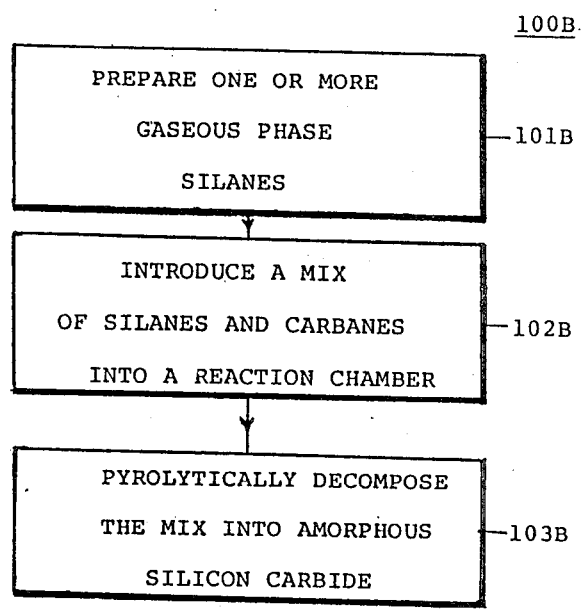

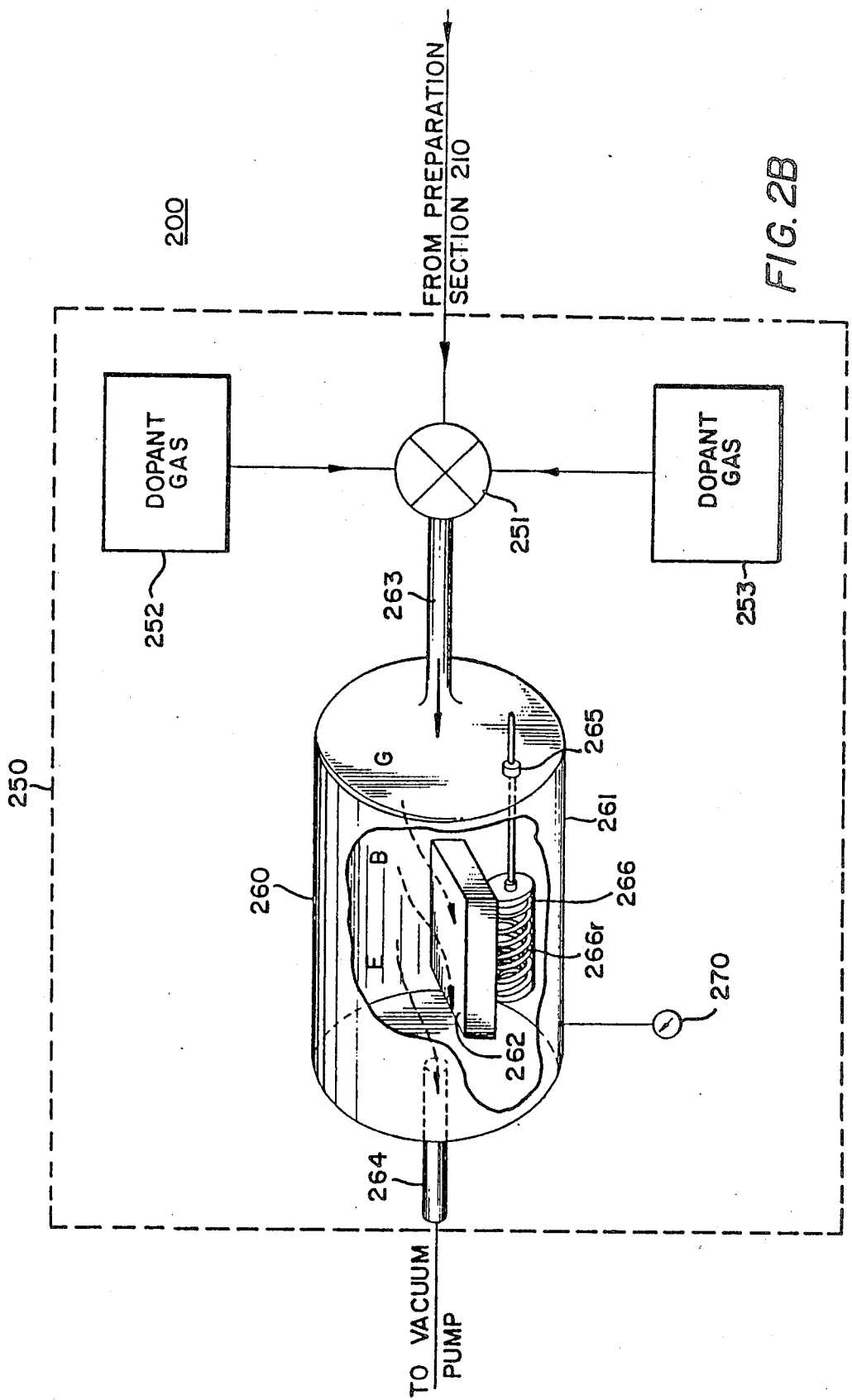

AMORPHOUS SILICON CARBIDE METHOD

BACKGROUND OF THE INVENTION

The invention relates to the production of hydrogenated amorphous semiconductor carbides, particularly to use in semiconductive devices.

Amorphous semiconductor carbides are useful in a wide variety of devices. Examples include heterojunction solar cells and electroluminescent devices, along with thin film, field effect, memory and display devices.

Amorphous semiconductor carbides are particularly useful for photovoltaic devices which provide a voltage when subjected to radiation or radiate when electrically energized. Unfortunately such devices are not presently competitive with conventional sources of electrical energy.

One attempt to provide comparatively low cost semiconductor carbides has involved the glow discharge decomposition of silane and methane or silane and ethane. Glow discharge decomposition results in undesirable ion bombardment which causes defects in the resulting carbide and requires excessive hydrogen bonding in order to compensate for the defects.

The consequence of the structural defects and the resulting need for additional hydrogen bonding has been to produce materials that are difficult to control and do not have predictable characteristics. In addition, they have displayed serious inadequacies in functioning as photovoltaic and related devices.

Accordingly, it is an object of the invention to achieve the efficient and low cost production of semiconductor carbides with suitable photoresponsive properties. A related object is to achieve suitable photovoltaic and photodetecting devices.

Another object of the invention is to provide for the production of semiconductor carbides with suitable photosensitivity with less cost and complexity than for existing methods.

A further object of the invention is to achieve semiconductor carbides at less cost and with less complexity than for glow discharge and other related production techniques.

SUMMARY OF THE INVENTION

In accomplishing the foregoing and related objects, the invention provides a method of preparing amorphous semiconducting alloys by the pyrolytic decomposition of a mixture of one or more semiconductanes and one or more carbanes. Semiconductanes are hydrides of semiconductor materials such as silicon and germanium. The hydrides of silicon are silanes and the hydrides of germanium are germanes. Carbanes are hydrides of carbon and include the normal members of the methane series. In general carbanes include all hydrocarbons, whether saturated or unsaturated.

In accordance with one aspect of the invention the semiconductanes are polysemiconductanes, i.e., include a plurality of semiconductor atoms. Similarly the carbanes desirably are polycarbanes and include a plurality of carbon atoms. The semiconductanes desirably are polysilanes and polygermanes.

In accordance with another aspect of the invention, the pyrolytic decomposition takes place in the range from about 300° C. to about 500° C. and preferably is in the range from about 350° C. to about 450° C.

In accordance with a further aspect of the invention, the decomposition takes place at a partial pressure of a gaseous mixture less than about one atmosphere and above about one Torr. A Torr is a unit of pressure equal to 1.333 millibars. The pressure is desirably in the range from about one Torr to about 100 Torrs in order to limit the gas phase nucleation of particles during the pyrolytic decomposition. Gas phase nucleation is a showering of particles which leads to a mixture of amorphous and crystalline materials.

In accordance with a still further aspect of the invention, the decomposition medium is gaseous and can include one or more dopant gases. The dopants are selected according to whether the conductivity produced by the dopant materials is "n" (negative) or "p" (positive). N-type dopant gases include phosphine, arsine and stibine. P-type dopant gases include diborane and organometallic materials. The latter are aliphatic in their organic part and are desirably methyl or ethyl. In addition, the metallic ions are desirably aluminum or gallium and are trivalent, being completely saturated by organic aliphatic radicals.

In accordance with yet another aspect of the invention. the decomposition medium includes an inert gas carrier. Suitable inert gas carriers are argon, helium, xenon, neon and hydrogen. The gas phase material is advantageously decomposed on a heated substrate and the decomposition temperature is that of the substrate.

In accordance with still another aspect of the invention, amorphous semiconductive devices are prepared by forming a body through the decomposition of one or more gaseous phase materials, including a layer formed by the pyrolytic decomposition of a mixture of one or more semiconductanes and one or more carbanes, and providing contacts for the body. The body is desirably formed on a substrate in one or more separate layers which can include dopants according to the conductivity desired. Auxiliary layers, such as metal to form an interface and antireflection layers, can also be included.

DESCRIPTION OF THE DRAWINGS

Other aspects of the invention will become apparent after considering several illustrative embodiments, taken in conjunction with the drawings in which:

FIG. 1A is a flow chart of the method in accordance with the invention for preparing amorphous semiconductor carbides;

FIG. 1B is an adaption of the flow chart of FIG. 1A for a method of preparing amorphous silicon carbides;

DETAILED DESCRIPTION

Figure 2A:
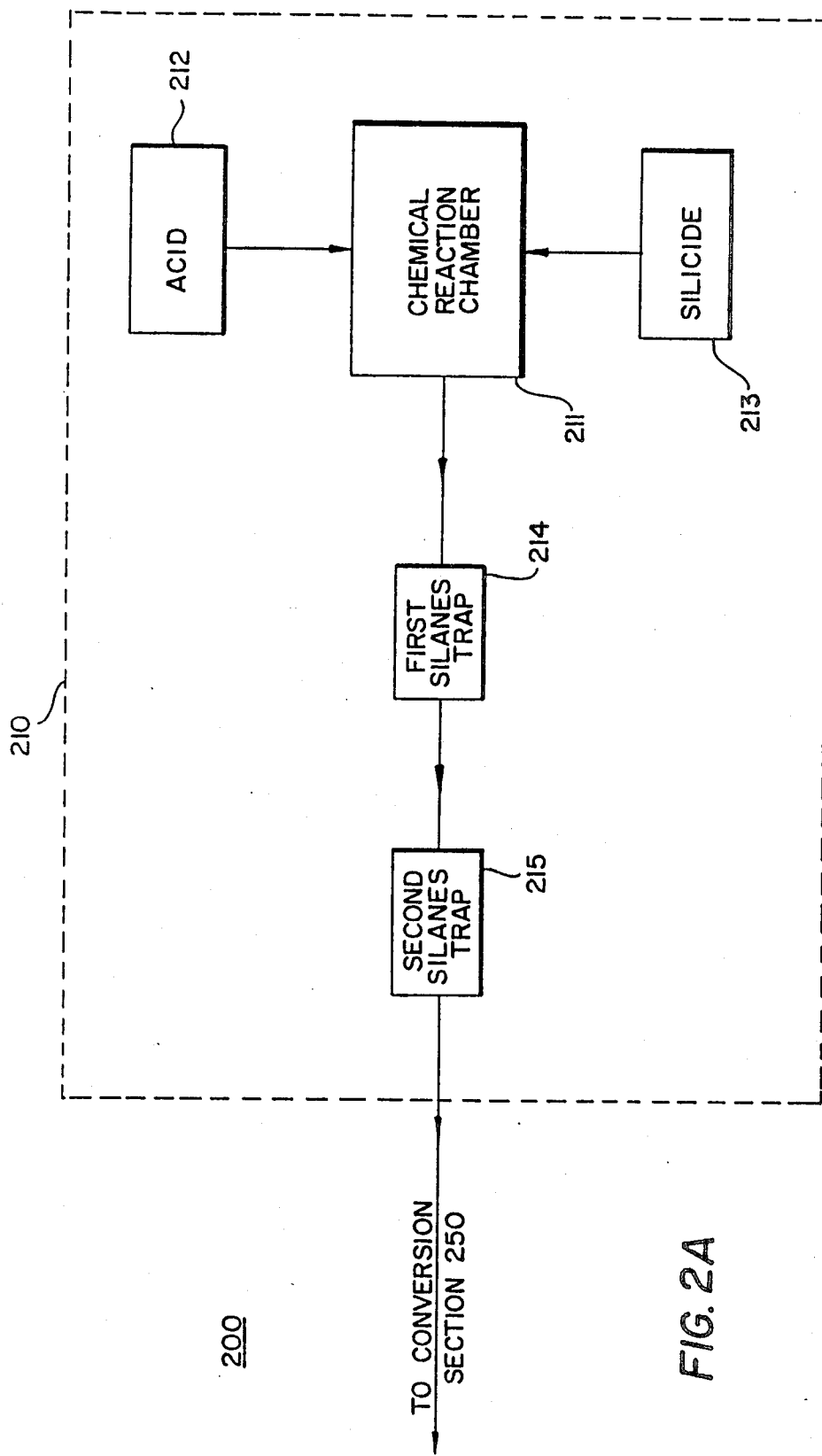
FIG. 2 is a schematic diagram of an illustrative reaction chamber for preparing amorphous semiconductor carbides in accordance with the invention.

With reference to the drawings, FIG. 1A sets forth a flow chart 100A for the general practice of the invention, while FIG. 1B provides a flow chart 100B for the particular preparation of amorphous silicon carbides having the special properties provided in accordance with the invention.

As illustrated in FIG. 1A, by process block 101A, the process begins with the preparation of one or more gaseous phase polyconductanes, which are semiconductanes. Semiconductanes for the practice of the invention are selected from Group IV of the Periodic Chart and thus can include compounds of germanium, tin, selenium and tellurium. As noted below, particularly suitable semiconductanes include silicon.

Once the semiconductanes are prepared, they are introduced with one or more carbanes into a reaction chamber, as symbolized by process block 102A. While in the chamber the mixture of one or more semiconductanes and one or more carbanes are pyrolytically decomposed as represented by process block 103A. Pyrolytic decomposition involves the effect of heat at a suitable temperature in converting material into an amorphous semiconductor.

In particular, the invention is suitable for the production of amorphous silicon carbides in accordance with the flow chart 100B of FIG. 1B. In this process, the semiconductanes take the form of silanes in accordance with process block 101B. Once produced, the silanes are introduced into a reaction chamber pursuant to process block 102B, together with one or more carbanes. While in the chamber the silane-carbane mixture is subjected to heating in accordance with process block 103B. This causes decomposition into amorphous silicon carbide. The resulting amorphous silicon carbide does not require subsequent treatment to compensate for hydrogen deficiencies. As in the case of semiconductor carbides produced in accordance with the flow chart of FIG. 1A, the amorphous silicon carbides produced in accordance with FIG. 1B are generally useful in a wide variety of semiconductor devices, which have thicker, damage resistant layers with enhanced photoconductive and photovoltaic properties.

In order to produce consistent results it is desirable for the pyrolytic decomposition to take place under homogeneous gas phase conditions. The materials produced under heterogeneous conditions tend to differ according to the particular set of conditions employed, but are nevertheless useful in many applications.

The gaseous mixture may further include dopants and inert gaseous carriers.

A suitable operating pressure is about one atmosphere, but lower pressures may be employed, as low as about one Torr. The pressure desirably lies in the range from about one Torr to about 100 Torrs in order to limit the gaseous phase nucleation.

A suitable operating temperature is in the range from about 300° C. to about 500° C. A particularly suitable range of temperature is from about 350° C. to about 500° C. When the gas phase mixture is passed over a substrate that is heated to one of the foregoing temperatures, or when the temperature is varied in at least a part of one of the foregoing ranges, a high quality film of amorphous silicon results on the substrate. A particularly high quality film is produced when monosilane is removed at least in part from the gas phase mixture. While levels of monosilane as low as 5 percent produce suitable results, the monosilane may be completely eliminated from the gas phase mixture. With monosilanes removed, the reaction rate to produce an amorphous silicon film with a thickness in the range from about one-half to one micron is on the order of five minutes. When the amount of monosilane in the mixture is as high as 50 percent, the reaction rate to produce the same film thickness is on the order of about four hours.

Very high order silanes, for example beyond hexasilane, have little effect on the production of the desired amorphous silicon film at standard temperatures and pressures because they have negligible vapor pressures at room temperatures. However, when the higher order silanes are heated to produce a significant vapor pressure, for example, above one millimeter of mercury, they also can provide high quality amorphous silicon film.

An illustrative arrangement for preparing amorphous semiconductors in accordance with the invention is illustrated in FIG. 2. The arrangement 200 is in two sections, 210 for the production of suitable semiconductanes and 250 for the conversion of the semiconductanes to the desired amorphous semiconductors. The arrangement 200 is specifically adapted for the production of amorphous silicons by pyrolytic decomposition, but it will be understood that appropriate modifications may be made for the production of other amorphous semiconductors.

The production section 210 includes a chemical reaction chamber 211 to which is applied a suitable acid from a source 212 and a silicide from a source 213. The reaction of the silicide, for example magnesium silicide, with the acid, for example hydrochloric, produces the desired higher order silanes. In particular, magnesium silicide is added to a 15 percent aqueous solution of hydrogen chloride to produce an exothermic reaction. This kind of reaction has been reported by Stock and Somieski in 49 *Chem. Ber.* 111 (1916). In this reaction approximately 25 percent of the silicide is converted to a mixture of silanes.

After the silane mix has been produced in the reaction chamber 211 it is applied to a series of traps 214 to exclude the silanes that are not desired for the pyrolytic decomposition which follows.

Monosilane and water are illustratively removed by passing the reaction products with a suitable inert gas carrier through various cold traps. Thus, a toluene-liquid nitrogen trap operating at −94° C. is used to remove water vapor and high order silanes above the desired silane level. In order to assure the selection of the desired high order silanes, a further trap 215 is included making use of pentane gas-liquid nitrogen operating at −134° C.

It will be understood that in some cases the entire gas phase mixture produced in the reaction chamber 211 can be applied directly to the conversion section 250.

In the illustrative conversion section 250, reactants, including the selected polysilanes, and carbanes, are applied to a reaction chamber 260 in the form of an envelope 261. The reaction chamber 260 illustratively contains a substrate 262 upon which amorphous silicon is to be deposited. The chamber 261 is of a material which will not contaminate the substrate 262. Suitable materials include quartz, glass, and stainless steel.

The illustrative reaction chamber 261 of FIG. 2 has an inlet 263 and an outlet 264. The inlet provides entry for selected polysilanes or a monosilane-polysilane mixture through a control valve 251 which allows the gaseous mixture to be supplemented by carbanes and one or more dopant gases from sources 252 and 253. Positioned below the inlet 263 is a support 265 for a holder 266 of the substrate 262. The substrate holder 266 illustratively is a cartridge heater with a wound ceramic core and a ceramic binder encompassing a resistive element 266r. The latter is energized by suitable wiring which extends to the support along the holder. A stainless steel case isolates the ceramic core from the incoming gaseous stream represented by the arrow G. A manometer 270 is mounted on the chamber 261 to give an indication of the internal pressure. The temperature of the substrate 262 is monitored by a gauge (not shown) included in the wiring for the heater 266r. The substrate 262 is typically of glass.

In order to make the desired amorphous silicon carbide deposit, the gaseous mixture G is passed over the substrate, being drawn toward the outlet 264 by the effect of a vacuum pump (not shown). The substrate 262 is operated at a temperature in the range from about 350° C. to 500° C. resulting in pyrolytic decomposition of at least a portion of the gaseous stream G. The decomposition components are indicated by the arrows B shown in dashed line form. The balance of the gaseous mixture, in the form of an exhaust E is drawn through the outlet 264.

The pressure within the chamber 261 is in the range from about one Torr to atmospheric. The Torr is a unit of pressure equal to about 1.333 millibars. It is the unit of pressure needed to support a column of mercury one millimeter in height under standard conditions.

As the vacuum is reduced the deposition rate is correspondingly reduced. The critical pressure considered is the partial pressure of the silane mixture at the inlet. If the partial pressure is too high, namely over about 100 Torrs, gas phase nucleation of particles takes place, producing a "shower" that results in a mixture of amorphous and crystalline silicon carbide.

The rate of deposition of amorphous silicon carbide can be controlled according to the amount of inert buffer gas accompanying the reactants, for example argon. The quantity of argon does not influence the partial pressure of the reactants so that it can be introduced at any suitable level, depending upon the desired modification in the rate.

In addition, the electrical properties of the deposited amorphous silicon carbide are controlled according to the nature of the dopant gases from the sources 252 and 253. For p-type doping, the dopant gas 252 can be boron hydride (borane), while for n-type doping the dopant gas 253 is phosphrous hydride (phosphine). Alternatively, the desired dopant hydrides can be formed in the gas mixture by incorporating magnesium boride and/or magnesium phosphide in the reactants. It will be appreciated that any of a wide variety of other dopants may be used. In some cases it is desirable for the same dopant gas to be selectively applied from two or more sources such as the sources 252 and 253.

It is to be noted that the major portion of the gaseous mixture G desirably is of an inert carrier gas in order to inhibit spontaneous combustion of the reactants in the event of the fracture of the chamber 261. While the substrate 262 of FIG. 2 has been chosen as glass for reasons of economy, metal substrates, particularly steel or stainless steel may be employed.

It is to be noted that the bandgap and composition of the hydrogenated amorphous silicon carbide film can be changed by changing the partial pressures of silanes and carbanes. The higher partial pressure of carbanes results in more carbon being incorporated in the film.

DETAILED DESCRIPTION OF DEVICES

Amorphous semiconductors produced in accordance with the invention can be used to form a wide variety of semiconductor devices.

Figure 3:
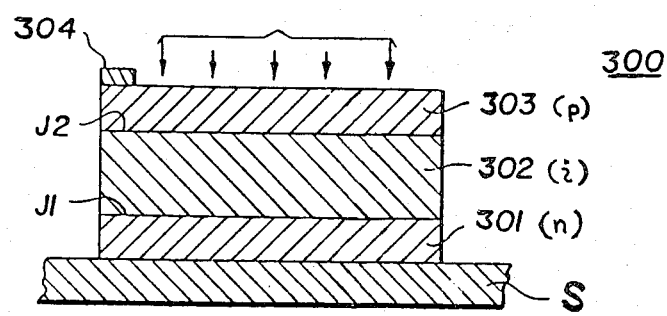
FIG. 3 is a schematic diagram of a heterojunction semiconductor in accordance with the invention.

One such device is the heterojunction P-I-N device of FIG. 3. The device 300 has different junctions J1 and J2 between n-type material 301 and intrinsic (i-type) material 302, on the one hand, and between the intrinsic material 302 and the p-type semiconductor material 303 on the other hand. The bandgaps of the n- and p-type materials 301 and 303 are different than for the intrinsic material 302. In the case of the n-type material, a dopant such as phosphorous is included. The p-type material also includes a suitable dopant, for example boron.

The particular structure 300 of FIG. 3 begins with a conducting substrate S upon which is deposited a first doped layer 301 of amorphous silicon hydride, produced by pyrolytic decomposition. Superimposed on the layer 301 is an undoped layer 302 that is also formed by pyrolytic decomposition, this time of at least a polysilane. Both layers 301 and 302 are deposited at a temperature in the range of about 350°–450° Centirgade. The pressure is approximately one Torr to ten Torrs. Upon the intrinsic layer 302, a p-type silicon carbide layer 303 is deposited by the pyrolytic decomposition of a mixture of polysilanes, methane and diborane. The temperature was 300°–450° C. with a variation of ±10 degrees Centigrade and the pressure was 1–10 T (Torrs). A semi-transparent metal contact 304 was evaporated on the edge of the device 300. The device 300 was tested for photovoltaic properties by subjecting it to 70 milliwatts of radiation from a quartz-iodine lamp which simulates the solar spectrum. The resulting device 300 had an open circuit voltage of 0.62 volts which is significantly higher than the voltage (0.55 volts) that is realized when the p-layer 303 does not contain carbon and is an amorphous silicon hydride layer.

Figure 4:
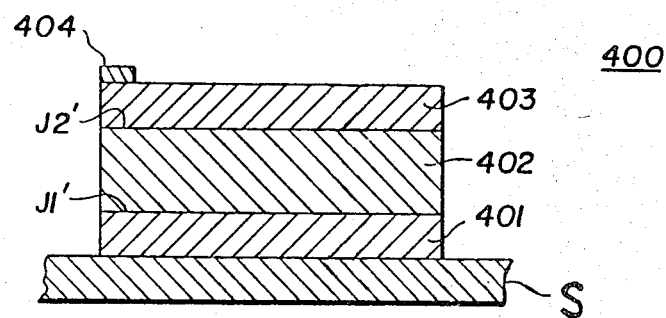
FIG. 4 is a schematic diagram of an alternative heterojunction device in accordance with the invention.

Another device which makes use of amorphous silicon carbide produced in accordance with the invention is the double heterojunction semiconductor 400 of FIG. 4. This device also has different junctions J1' and J2' between material 401 of one conductivity type and intrinsic material 402, on the one hand, and between the intrinsic material 402 and material 403 of an opposite conductivity type. By contrast with the device 300 of FIG. 3 where the heterojunction was the junction J2 between the p-layer 303 and the i-layer 302, in the case of FIG. 4, both of the junctions J1' and J2' are heterojunctions.

The same conducting substrate S can be used as in the case of FIG. 3. On the conducting substrate S is deposited a first doped layer 401 of amorphous silicon carbide. This is followed by an undoped or lightly doped silicon hydride layer 402. The final layer 403 is of amorphous silicon carbide, of conductivity type opposite to that of the first doped layer 401. The result is the desired double heterojunction structure.

All of the layers 401, 402 and 403 are formed by the pyrolytic decomposition of gaseous phase materials. In the case of the heterojunction layers 401 and 402 the gaseous phase material includes one or more silanes and one or more carbanes. In the case of the intermediate intrinsic layer 402, the gaseous medium omits the carbanes. In all cases the deposition is formed by pyrolytic decomposition.

The structure 400 has the advantage of permitting higher voltages than can be obtained with a single heterostructure. The provision of a high bandgap layer 401 allows the efficient reflection of incident light into the amorphous silicon hydride layer 402. This brings about a further increase in efficiency.

While FIGS. 3 and 4 deal with photovoltaic devices, other semiconducting devices, such as electroluminescent cells can be produced in accordance with the invention. For example, the heterostructure 300 of FIG. 3, when subjected to a forward electrical bias can emit optical radiation because of the recombination of injected electrons and holes in the intrinsic layer 302. The higher bandgap of the alloy layer 303 assures that most of the radiation will escape from the structure 300.

Alternatively, a hetero- or homojunction electroluminescent P-I-N cell can be produced in accordance with the invention by making all three layers from amorphous silicon carbide. Such a cell can emit radiation efficiently over the entire visible spectrum. This result is obtained because the bandgap of amorphous silicon carbide alloy produced in accordance with the invention can be changed by changing the partial pressures of the mixture of carbanes and silanes. As the carbon content of the alloy increases, the bandgap increases so that there is a proportionate increase in radiant energy in the visible range.

An alternative to the structure 400 is a Schottky barrier cell in which the layer 403 is replaced by a metal Schottky barrier that forms a junction of a polarity opposite to the polarity of the junction between the layers 401 and 402. Such a cell could employ platinum, Pd or Au as the Schottky barrier, an undoped amorphous silicon hydride layer 402 and an n-doped amorphous silicon carbide layer 401. Alternatively, the Schottky barrier may be formed by a conducting polymer such as polyacetylene or sulfur nitride.

It is to be noted further that instead of metal contacts, such as the contact 304 of FIG. 3, other semitransparent ohmic contacts, such as indium-tin oxide or doped tin oxide, may be used.

While various aspects of the invention have been set forth by the drawings and specification, it is to be understood that the foregoing detailed description is for illustration only and that various changes in parts, as well as the substitution of equivalent constituents for those shown and described may be made without departing from the spirit and scope of the invention as set forth in the appended claims.

What is claimed is:

1. The method of preparing an amorphous semiconducting alloy of a semiconductor element, carbon, and hydrogen, which comprises pyrolytically decomposing a gaseous mixture of one or more polysemiconductanes and one or more carbanes exerting a partial pressure in the range above about 1 Torr and below about 1 atmosphere.

2. The method of claim 1 wherein the carbanes are polycarbanes.

3. The method of claim 1 wherein the polysemiconductanes are polysilanes or polygermanes.

4. The method of claim 1 wherein the pyrolytic decomposition takes place in the range from about 300° C. to about 500° C.

5. The method of claim 1 wherein said mixture includes an inert gas.

6. The method of claim 5 wherein the inert gas is selected from the class consisting of argon, helium, xenon, neon, and hydrogen.

7. The method of claim 1 wherein said mixture includes one or more dopants.

8. The method of claim 7 wherein said mixture includes a dopant gas and an inert gas.

9. The method of claim 8 wherein the dopant is a gas selected from the class consisting of phosphine, arsine, and stibine; thereby to produce an n-type doped amorphous alloy.

10. The method of claim 8 wherein the dopant is diborane gas; thereby to produce a p-type doped amorphous alloy.

11. The method of claim 10 wherein said dopant is an organo-metallic material.

12. The method of claim 11 wherein said organo-metallic material is selected from the class consisting of tri-methyl aluminum, tri-ethyl aluminum, tri-methyl gallium and tri-ethyl gallium.

13. The method of claim 11 wherein said organo-metallic material is an aliphatic-metallic material.

* * * * *